United States Patent
Choi

[11] Patent Number: 5,521,871
[45] Date of Patent: May 28, 1996

[54] VOLTAGE BOOSTING CIRCUIT OF A SEMICONDUCTOR MEMORY CIRCUIT

[75] Inventor: Hoon Choi, Kyungki-do, Rep. of Korea

[73] Assignee: Samsung Electronics Co., Ltd., Suwon, Rep. of Korea

[21] Appl. No.: 342,050

[22] Filed: Nov. 17, 1994

[30] Foreign Application Priority Data

Nov. 17, 1993 [KR] Rep. of Korea ................ 24483/1993

[51] Int. Cl.⁶ ............................................. G11C 11/34
[52] U.S. Cl. ...................... 365/189.11; 365/189.09; 365/204; 365/226; 327/536
[58] Field of Search ................... 365/189.09, 189.11, 365/204, 226; 327/534, 536

[56] References Cited

U.S. PATENT DOCUMENTS 5,394,365  2/1995  Tsukikawa ................ 365/189.09
5,434,820  7/1995  Kim ........................... 365/189.09
5,446,697  8/1995  Yoo et al. ...................... 365/226

FOREIGN PATENT DOCUMENTS 85493   5/1985  Japan.
207962  8/1989  Japan.

*Primary Examiner*—Viet Q. Nguyen

[57] ABSTRACT

A voltage boosting circuit for boosting a supply voltage VCC supplied from a system to a desired boosting voltage VPP level. The voltage boosting circuit includes a transmission transistor formed by a triple-well process. The transmission transistor has bipolar characteristics and operates as a bipolar diode.

8 Claims, 2 Drawing Sheets

VOLTAGE BOOSTING CIRCUIT OF A SEMICONDUCTOR MEMORY CIRCUIT

BACKGROUND OF THE INVENTION

The present invention relates to a semiconductor memory device, and more particularly, to a voltage boosting circuit (the term referred to herein as a "voltage boosting circuit" has the same meaning in this field as a boosting circuit, a boosting voltage generating circuit, a bootstrap circuit, etc.) for boosting a supply voltage supplied from a system to a desired boosting voltage level.

In a semiconductor memory device such as a dynamic RAM (random access memory) etc., the transmission of data can cause a shift of an effective voltage potential of the memory. In a dynamic RAM consisting of CMOS transistors, there occurs a voltage drop by the threshold voltage of the MOS transistor while the potential is transmitted through the channel region of the MOS transistor. This inevitable voltage drop becomes an obstacle to the accurate reading or writing of data as well as potentially causing the loss of data. To solve such a problem, a voltage boosting circuit for raising a voltage level has come to be used. As techniques for such a voltage boosting circuit, there are Korean patent No. 91-19740, filed Nov. 7, 1991, assigned to Samsung Electronics Co., Ltd. of Kyungki-do, Rep. of Korea, entitled "A VOLTAGE BOOSTING CIRCUIT"; a paper entitled "A 35 ns 64 Mb DRAM Using On-Chip Boosted Power Supply", 1992 Symposium on VLSI Circuits Digest of Technical Papers, pp. 64–65; U.S. Pat. No. 4,704,706 granted to Japan Fujitsu Co.; and the like.

FIG. 1 schematically shows a characteristic portion of a voltage boosting circuit which is generally well known in the art and described in the aforementioned techniques. An input node 2 receives an oscillating signal φOSC generated from an oscillator (not shown). A pumping capacitor 4 has one terminal of the electrode coupled to the input node 2 and the other terminal of the electrode coupled to a pumping node 8. A pumping capacitor 6 has one terminal of the electrode coupled to the input node 2 and the other terminal of the electrode coupled to a pumping node 10. A transmission transistor 12 with the gate and drain connected to the pumping node 8 and 10 respectively generates a boosting voltage VPP. Although not shown in FIG. 1, there is further provided a precharge circuit for precharging the pumping nodes 8 and 10 to a supply voltage VCC level. The construction of FIG. 1 is known in the art as a charge pump circuit. The oscillator operates when the boosting voltage VPP is lowered to a level lower than a normal level by an internal circuit during power-up of a chip and during the active cycle. If the oscillating signal φOSC is supplied to the input node 2, the pumping capacitors 4 and 6 boost the pumping nodes 8 and 10 to about twice the supply voltage VCC. A voltage charged to the pumping node 10 is generated through the channel of the transmission transistor 12 as the boosting voltage VPP. The circuit of FIG. 1 is driven by the oscillator using as source voltage the supply voltage VCC, so that the boosting voltage VPP level of 2 VCC-VT (where VT is the threshold voltage of the transmission transistor 12) can be obtained. The pumping nodes 8 and 10 are initially precharged to the supply voltage VCC level.

The voltage boosting circuit of FIG. 1 is formed by a typical CMOS manufacturing process. The circuit of FIG. 1 has the problem of pumping efficiency in that the transmission transistor 12 is an NMOS transistor formed by the CMOS manufacturing process. As is well known to those skilled in the art, the MOS transistor has device characteristics that a body effect increases with the increase in a voltage level across its source and drain. It is apparent that the body effect further increases since the size of each device is shortened and space thereof becomes narrower with increasing integration of a semiconductor memory device. The boosting voltage circuit of FIG. 1 has a fundamental problem that the pumping efficiency is lowered by the device characteristics of the MOS transistor, i.e. of the transmission transistor, rather than by circuit design.

SUMMARY OF THE INVENTION

It is an object of the invention to provide a voltage boosting circuit for improving pumping efficiency.

It is another object of the invention to provide a voltage boosting circuit for generating a boosting voltage at high speed.

It is still another object of the invention to provide a voltage boosting circuit for improving pumping efficiency irrespective of the occurrence of a body effect even if a boosting voltage level increases.

It is a further object of the invention to provide a voltage boosting circuit for raising pumping efficiency by the device characteristics of a transmission transistor.

In accordance with one aspect of the present invention, there is provided a voltage boosting circuit for generating a boosting voltage through a transmission transistor with bipolar transistor characteristics. The voltage boosting circuit includes the transmission transistor formed by a triple-well process of a typical CMOS manufacturing process. The transmission transistor operates as a bipolar diode including a first well of a second type formed on a substrate of first type, a second well of a first type formed within the first well, a first diffusion layer of a second type formed within the first well but not within said second well, the first diffusion layer being connected to a line connected to a pumping capacitor, a first diffusion layer of a first type formed within said second well and connected to said line, and a second diffusion layer of a second type formed within said second well and connected to a boosting node.

BRIEF DESCRIPTION OF THE DRAWINGS

For a better understanding of the invention and to show how the same may be carried into effect, reference will now be made, by way of example only, to the attached diagrammatic drawings, in which.

DETAILED DESCRIPTION OF THE PREFERRED EMBODIMENT

Figure 1:
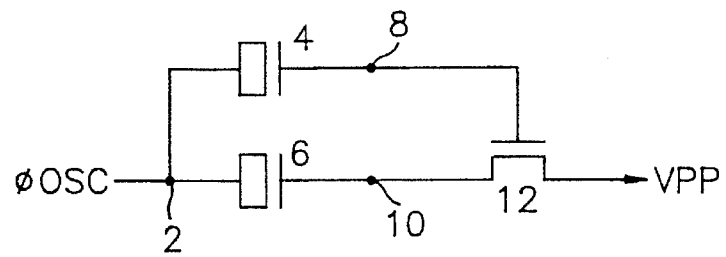
FIG. 1 is a schematic diagram illustrating a characteristic portion of a conventional voltage boosting circuit.
Figure 2:
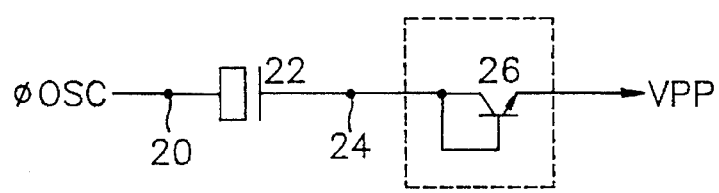
FIG. 2 is an equivalent circuit diagram illustrating a schematic construction of a voltage boosting circuit according to the present invention.

Referring to FIG. 2, a voltage boosting circuit according to the present invention uses a bipolar transistor 26 as a transmission transistor for generating a boosting voltage VPP. It should be noted that the term bipolar transistor has the same meaning as the terms "bipolar diode" and "bipolar transmission transistor" used below. As is well known to those skilled in the art, a bipolar transistor is a current controlled device, while a MOS transistor is a voltage controlled device. The bipolar transistor has advantages in that the switching speed is improved and the driving force increases. The transmission transistor 26 made of the bipolar transistor has sophisticated device features as the voltage boosting circuit, such as the improvement of the pumping efficiency, the high speed boosting operation to a desired boosting level, and the prevention of the body effect.

Figure 3:
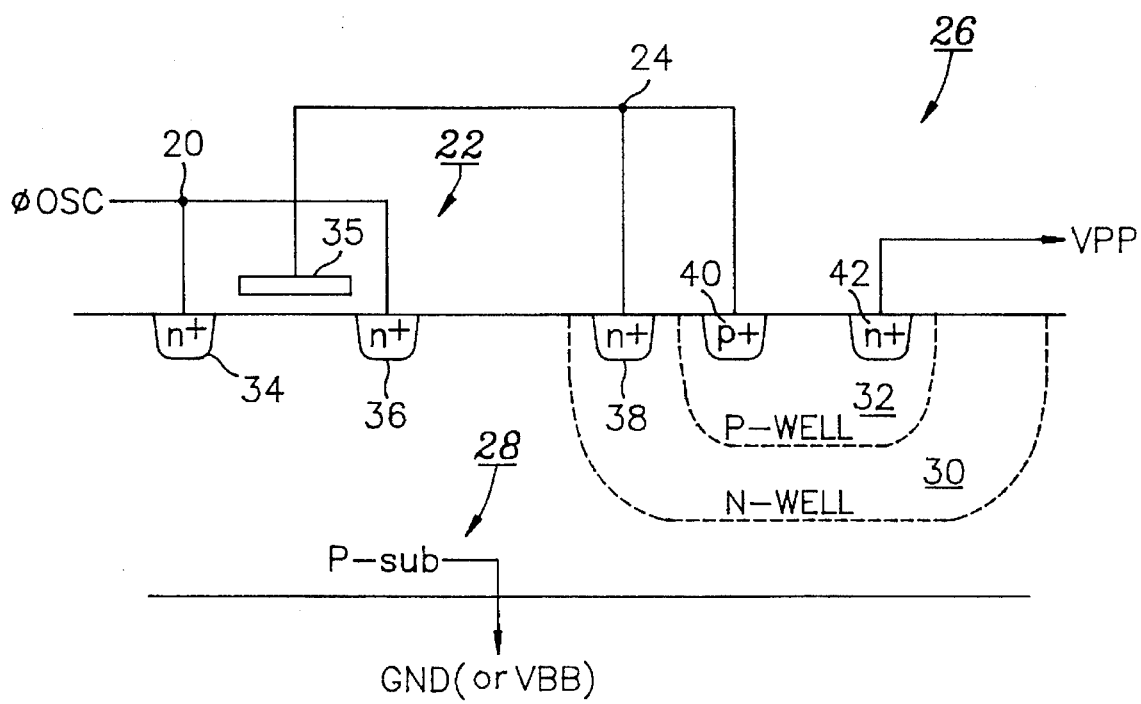
FIG. 3 is a sectional view of the circuit of FIG. 2.

FIG. 3 is a sectional view of the circuit of FIG. 2. The bipolar transistor 26 is formed by a triple-well process of a typical CMOS manufacturing process. A process for manufacturing the bipolar transistor 26 as a transmission transistor will now be described in brief. An N-well 30 is formed on a P-type substrate 28. A P-well 32 is formed at the middle portion with the N-well 30. Within the N-well 30 except where the P-well 32 is formed, an n+ layer 38 is formed by implantation of an n+ impurity. A p+ layer 40 and an n+ layer 42 are formed within the P-well 32 by implantation of p+ and n+ impurities, respectively. Thus the structure of the bipolar transistor 26 shown in FIG. 2 is completed. The n+ layers 34 and 36 formed by implantation of the n+ impurity on the P-type substrate 28 and a gate 35 constitute a pumping capacitor 22 of FIG. 2. Since the structure of FIG. 3 is easily achieved using a typical manufacturing process, details such as a mask process, a diffusion process, etc. are omitted. The n+ layers 34 and 36 are connected to an input node 20 and pumps the gate 35 formed thereon in response to a voltage across the input node 20, thereby pumping a pumping node 24 coupled to the gate 35. It should be noted that the pumping node 24 is commonly connected to the n+ layer 38 within the N-well 30 and the p+ layer 40 within the P-well 32, and details thereof will be discussed later on. A line to which the boosting voltage VPP is applied is connected to the n+ layer 42 within the P-well 32. It will be readily appreciated that the bipolar transistor 26 operates through the P-well 32 between the pumping node 24 and the boosting voltage VPP line. To pump the boosting voltage VPP through the bipolar transistor 26, the pumping node 24 should be isolated from the P-type substrate 28. Otherwise, a pumping voltage charged to the pumping node 24 is discharged through the substrate 28. One skilled in the art will appreciate the need for the formation of the bipolar transistor within the N-well 30 to prevent the pumping voltage from discharging.

The reason why the pumping node 24 is commonly connected to the n+ layer 38 within the N-well 30 and the p+ layer 40 within the P-well 32 will now be described.

If the pumping node 24 cannot supply the pumping voltage to the N-well 30 through the n+ layer 38, that is, if the pumping node 24 supplies the pumping voltage only to the p+ layer 40 within the P-well 32, there is formed a P-N forward bias. Accordingly, a high voltage applied to the P-well 32 is drained to the N-well 30. Then the n+ layer 42 of the P-well 32 is not pumped to a desired level. Hence, the high voltage should be supplied from the N-well 30. To overcome this problem, it is desirable that the pumping node 24 is connected to the n+ layer 38 within the N-well 30. Meanwhile, it is desirable that the P-type substrate 28 is connected to a ground voltage GND or a substrate voltage VBB in order to prevent a P-N forward bias. If the bipolar transistor 26 with the above-mentioned triple-well structure is formed, there are no current variations even though the boosting voltage VPP is raised, thereby minimizing a pumping time for pumping the boosting voltage VPP to a desired voltage. Therefore, the pumping efficiency increases and the device operating characteristics of the voltage boosting circuit are ensured.

Figure 4:
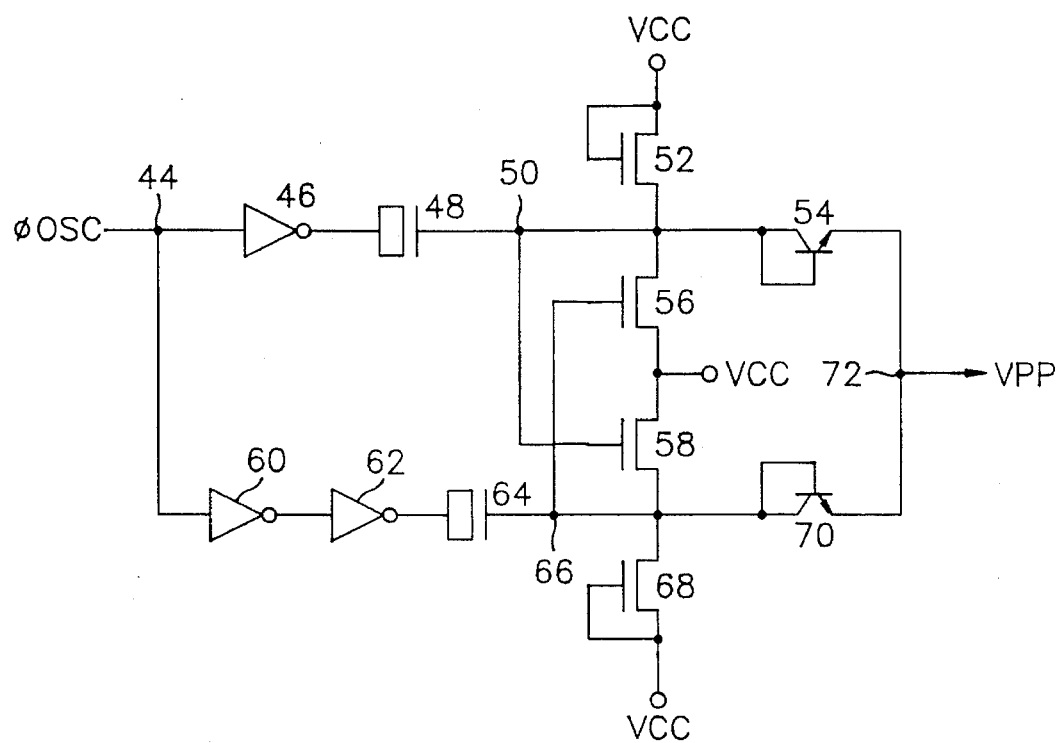
FIG. 4 is a circuit diagram illustrating one embodiment of a voltage boosting circuit constructed in accordance with FIGS. 2 and 3; and, FIG. 5 is a waveform chart illustrating a rising slope of a resultant boosting voltage Vpp of the circuit of FIG. 4.

FIG. 4 is one embodiment of the voltage boosting circuit constructed in accordance with FIGS. 2 and 3. The voltage boosting circuit of FIG. 4 shows the construction of a charge pump circuit. The voltage boosting circuit performs a double pumping operation in response to a logic change of a triggered oscillating signal φOSC from an oscillator. An input node 44 receives the oscillating signal φOSC generated from the oscillator (not shown). A first inverter 46 has an input terminal connected to the input node 44. A first pumping capacitor 48, connected between the first inverter 46 and a first pumping node 50, pumps the first pumping node 50 in response to the voltage level of the output signal of the first inverter 46. A first precharge transistor 52 precharges the first pumping node 50 to a voltage level VCC-Vtn. A first bipolar transistor 54 of an NPN transistor has its base and collector commonly connected to the first pumping node 50 and its emitter connected to a boosting node 72 for generating the boosting voltage VPP. A second inverter 60 has an input terminal connected to the input node 44, and a third inverter 62 has an input terminal connected to the output terminal of the second inverter 60. A second pumping capacitor 64, connected between the third inverter 62 and a second pumping node 66, pumps the second pumping node 66 in response to the voltage level of the output signal of the third inverter 62. A second precharge transistor 68 precharges the second pumping node 66 to the voltage level VCC-Vtn. A second bipolar transistor 70 of an NPN transistor has its base and collector commonly connected to the second pumping node 66 and its emitter connected to the boosting node 72. A third precharge transistor 56, having its channel connected between a supply voltage VCC terminal and the first pumping node 50 and having its gate connected to the second pumping node 66, precharges the first pumping node 50 to the supply voltage VCC level. A fourth precharge transistor 58, having its channel connected between the second pumping node 66 and the supply voltage VCC terminal and having its gate connected to the first pumping node 50, precharges the second pumping node 66 to the supply voltage VCC level. The structure of FIG. 4 has a feature that the charge pump circuit uses a bipolar transistor as the transmission transistor.

The operation of the circuit of FIG. 4 will now be discussed. After power-up of a chip, when the voltage boosting circuit of FIG. 4 is in a disabled state, either by maintaining the boosting voltage VPP at a desired level or before the chip is enabled, the pumping nodes 50 and 66 are precharged to the voltage level VCC-Vtn by the precharge operation of the first and second precharge transistors 52 and 68. Where Vtn is the threshold voltage of the precharge transistor 52 and 68 of an NMOS transistor. Thereafter, if the chip is enabled or the boosting voltage VPP is lowered to a level lower than the desired level, the voltage boosting circuit FIG. 4 is enabled. Then the oscillating signal φOSC is supplied to the input node 44 as a square wave having a constant period. The detailed description is as follows:

First, if the oscillating signal φOSC supplied to the input node 44 is raised from logic "low" to logic "high", the first inverter 46 generates logic "low". There is no pumping operation through the first pumping capacitor 48 and the first pumping node 50 maintains its precharge level. The second and third inverters 60 and 62 generate logic "low" and "high", respectively. The second pumping capacitor 64 boosts the second pumping node 66 to twice the voltage level VCC-Vtn. The boosted voltage level of the second pumping node 66 is transmitted through the second bipolar transistor 70 to the boosting node 72 to raise the boosting voltage VPP. The second bipolar transistor 70 is a device formed by the structure shown in FIG. 3. During the charge sharing operation of the second pumping node 66 and the boosting node 72 through the second bipolar transistor 70, the second bipolar transistor 70 has the device characteristics described in reference to FIG. 3. Thus the high voltage charged to the pumping node 66 is transmitted to the boosting node 72 at high speed, and the body effect does not take place even though the boosting node 72 achieves a high voltage level. The emitter of the first or second bipolar transistor 54 or 70 corresponds to the n+ layer 42 within the P-well 32 of FIG. 3, the base of which is the p+ layer 40 within the P-well 32 of FIG. 3, and the collector of which is the n+ layer 38 within the N-well 30 of FIG. 3. Thus, it will be readily understood that the body effect does not occur even though the boosting node 72 is raised to the high voltage. The voltage level 2 (VCC-Vtn) pumped at the second pumping node 66 fully turns on the channel of the third precharge transistor 56 to precharge the first pumping node 50 to the supply voltage VCC level.

Second, if the oscillating signal φOSC supplied to the input node 44 is lowered from logic "high" to "low", the first inverter 46 generates logic "high". The first pumping capacitor 48 pumps the first pumping node 50 from the previous precharge level VCC (this level is obtained through the third precharge transistor 56 in the aforementioned process) to twice the precharge level VCC. The boosted voltage level of the pumping node 50 is transmitted to the boosting node 72 via the first bipolar transistor 54 to raise the boosting voltage VPP to a higher level than the previous boosting voltage level. The first bipolar transistor 54 is also formed by the structure shown in FIG. 3 and the device characteristics described in reference to FIG. 3 are maintained during the charge sharing operation of the first pumping node 50 and the boosting node 72 through the first bipolar transistor 54. Therefore, the high voltage charged to the pumping node 50 is transmitted to the boosting node 72 at high speed, and the body effect caused by the raised voltage of the boosting node 72 is prevented. At this time, the second and third inverters 60 and 62 generate logic "high" and "low" respectively. There is no pumping operation of the second pumping node 66 through the second pumping capacitors 64. The voltage level 2 VCC pumped at the first pumping node 50 fully turns on the channel of the fourth precharge transistor 58 to precharge the second pumping node 66 to the supply voltage VCC level. Consequently, the efficiency of the next pumping operation is raised.

If the oscillating signal φOSC is again raised from logic "low" to "high", the aforementioned first process is repeated. The precharge level of the first pumping node 50 becomes the supply voltage VCC level and then the pumping operation proceeds. A succession of processes is repeated until the boosting voltage VPP is raised to the desired boosting voltage level, and through these processes the boosting voltage VPP is raised to the prescribed voltage level.

Figure 5:
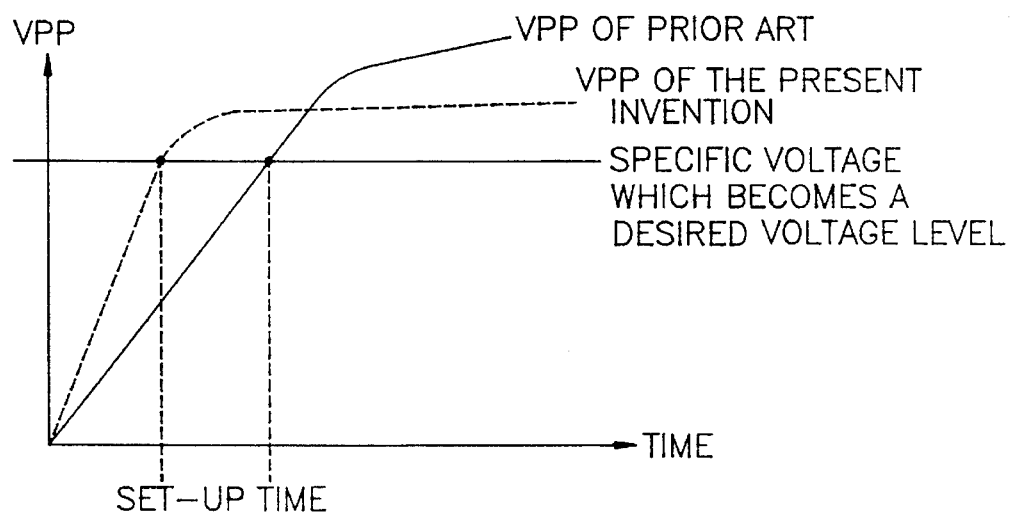

FIG. 5 shows a rising slope of the boosting voltage VPP resulting from the operating characteristics of FIG. 4. As shown, the inventive voltage boosting circuit has a faster set-up time to raise the boosting voltage VPP to a desired boosting voltage level (about twice the supply voltage VCC) than the conventional circuit. It is apparent that these characteristics can be achieved by the first and second bipolar transistors 54 and 70 of FIG. 4 constructed in accordance with the structure of FIG. 3.

As described above, the voltage boosting circuit embodying the present invention raised the boosting voltage VPP to a desired boosting voltage level by using a charge pump circuit having a bipolar transistor. Even if the boosting voltage VPP across the boosting node is raised, the boosting efficiency is raised since there are no current variations flowing into the boosting node. Further the body effect which increases in proportion to the raised boosting voltage in a typical voltage boosting circuit is prevented.

The foregoing description shows only a preferred embodiment of the present invention. Various modifications are apparent to those skilled in the art without departing from the scope of the present invention.

What is claimed is:

1. A voltage boosting circuit for use in a semiconductor memory device, comprising:

an input node for receiving an oscillating signal having a constant period;

a pumping node, said pumping node being precharged to a prescribed voltage level;

a boosting node, said boosting node being raised to a boosting voltage higher than a supply voltage;

a pumping capacitor connected between said input node and said pumping node, said pumping capacitor pumping said pumping node in response to a voltage level supplied to said input node; and a bipolar diode connected between said pumping node and said boosting node, for transmitting a voltage charged to said pumping node to said boosting node.

2. The voltage boosting circuit as set forth in claim 1, wherein said bipolar device is an NPN bipolar transistor.

3. A voltage boosting circuit for use in a semiconductor device including an oscillator, said voltage boosting circuit, comprising:

an input node for receiving an oscillating signal;

a first inverter with an input terminal connected to said input node;

a first pumping capacitor connected between said first inverter and a first pumping node, said first pumping capacitor pumping said first pumping node in response to a voltage level of an output signal of said first inverter;

a first precharge transistor for precharging said first pumping node to a level corresponding to a supply voltage;

a first bipolar transistor with a base and collector commonly connected to said first pumping node and with an emitter connected to a boosting node for generating a boosting voltage higher than said supply voltage;

a second inverter with an input terminal connected to said input node;

a third inverter with an input terminal connected to an output terminal of said second inverter;

a second pumping capacitor connected between said third inverter and a second pumping node, said second pumping capacitor pumping said second pumping node in response to a voltage level of an output signal of said third inverter;

a second precharge transistor for precharging said second pumping node to said level corresponding to said supply voltage; and a second bipolar transistor with a base and collector commonly connected to said second pumping node and with an emitter connected to said boosting node.

4. The voltage boosting circuit as set forth in claim 3, further comprising:

a third precharge transistor with the channel connected between said first pumping node and a supply voltage terminal and with the gate connected to said second pumping node, said third precharge transistor precharging said first pumping node to a level corresponding to a full supply voltage level; and a fourth precharge transistor with the channel connected between said second pumping node and said supply voltage terminal and with the gate connected to said first pumping node, said fourth precharge transistor precharing said second pumping node to said level corresponding to said full supply voltage.

5. The voltage boosting circuit of claim 3, wherein the oscillator generates an oscillating signal having a square wave of constant period.

6. The voltage boosting circuit of claim 3, wherein the first and second bipolar transistors are bipolar transmission transistors.

7. The voltage boosting circuit of claim 1, wherein the bipolar device is a bipolar diode.

8. The voltage boosting circuit of claim 1, wherein the bipolar device is a bipolar transistor.

* * * * *